United States Patent
Mattia (10) Patent No.: US 10,418,976 B1
(45) Date of Patent: Sep. 17, 2019

(54) CHARGE STEERING TRANSMITTER

(71) Applicant: IQ-Analog Corporation, San Diego, CA (US)

(72) Inventor: Oscar Elisio Mattia, San Diego, CA (US)

(73) Assignee: IQ-Analog Corporation, San Diego, CA (US)

( * ) Notice: Subject to any disclaimer, the term of this patent is extended or adjusted under 35 U.S.C. 154(b) by 0 days.

(21) Appl. No.: 16/194,473

(22) Filed: Nov. 19, 2018

(51) Int. Cl.
- H03K 17/00 (2006.01)
- H03K 3/012 (2006.01)
- H03K 17/693 (2006.01)
- H03K 17/687 (2006.01)

(52) U.S. Cl.
CPC ......... *H03K 3/012* (2013.01); *H03K 17/6872* (2013.01); *H03K 17/693* (2013.01)

(58) Field of Classification Search
CPC ...... H03K 3/012; H03K 5/1252; H03K 5/135; H03K 17/005; H03K 17/162; H03K 17/6872; H03K 17/693; H03K 17/74; G06F 1/08
See application file for complete search history.

(56) References Cited

U.S. PATENT DOCUMENTS

| | | | | |
|---|---|---|---|---|
| 2009/0259781 A1* | 10/2009 | Padaparambil | ........ | H03K 5/135 710/71 |
| 2017/0063351 A1* | 3/2017 | Kurokawa | ....... | H03K 3/356104 |

OTHER PUBLICATIONS

Razavi, B. Charge steering: A low-power design paradigm. Proceedings of the IEEE Custom Integrated Circuits Conference, 2013.
Chang, Y., Manian, A., Kong, L. and Razavi, B. An 80-Gb/s 44-mW Wireline PAM4 Transmitter. IEEE Journal of Solid State Circuits, 2018.
Chang, Y., Manian, A., Kong, L. and Razavi, B. A 32-mW 40-Gb/s CMOS NRZ Transmitter. IEEE Custom Integrated Circuits Conference (CICC), 2018.
Razavi, B. Design of Integrated Circuits for Optical Communication Systems. McGraw-Hill, Chapter 10, 2003.
Kim et al., "A 112Gb/s PAM-4 Transmitter with 3-Tap FFE in 10nm CMOS", 2018 IEEE Int. Solid-State Circuits Conf., Feb. 12, 2018, Session 6.1.
Jung et al., "A 25Gb/s 5.8mW CMOS Equalizer", 2014 IEEE Int. Solid-State Cicuits Conference, Feb. 10, 2014, Session 2.4.
Jung et al., "A 25-Gb/s 5-mW CMOS CDR/Deserializer", IEEE Journal of Solid-State Circuits, vol. 48, No. 3, Mar. 2013.
Manian et al., "A 40-Gb/s 14-mW CMOS Wireline Receiver", IEEE Journal of Solid-State Circuits, vol. 52, No. 9, Sep. 2017.

* cited by examiner

Primary Examiner — Long Nguyen
(74) Attorney, Agent, or Firm — Law Office of Gerald Maliszewski; Gerald Maliszewski (57) ABSTRACT

Disclosed herein is circuitry that extends the charge-steering (CS) logic library with a 2:1 CS-multiplexor (MUX) cell that can be used in a tree fashion to compose a $2^N:1$ CS-MUX. Also presented is the integration of $2^N:1$ CS-MUX with conventional CMOS signals at a parallel input, and a current-mode driver at the serialized output. Also presented are a non-return-to-zero (NRZ) to RZ serializing transmitter, a charge-steering multiplexor (CSM) pre-driver, and a CSM transmitter.

8 Claims, 9 Drawing Sheets

| d0 | d2 | ck1 | d02 | $\overline{d02}$ |
|---|---|---|---|---|
| x | 1 | 1 | x | $\overline{x}$ |
| 1 | x | 1 | x | $\overline{x}$ |
| x | x | 0 | 1 | 1 |

| d1 | d3 | $\overline{ck1}$ | d13 | $\overline{d13}$ |
|----|----|----|----|----|
| x | 1 | 1 | x | $\overline{x}$ |
| 1 | x | 1 | x | $\overline{x}$ |
| x | x | 0 | 1 | 1 |

| d02 | d13 | ck2 | d0123 | $\overline{d0123}$ |
|-----|-----|-----|-------|--------------------|
| x   | 1   | 1   | x     | $\overline{x}$     |
| 1   | x   | 1   | x     | $\overline{x}$     |
| x   | x   | 0   | 1     | 1                  |

| d0 | d2 | ck1 | d02 | $\overline{d02}$ |
|---|---|---|---|---|
| x | 1 | 1 | x | x |
| 0 | x | 1 | x | x |
| x | x | 0 | 0 | 0 |

CHARGE STEERING TRANSMITTER

BACKGROUND OF THE INVENTION

1. Field of the Invention

This invention generally relates to digital communications and, more particularly, to charge-steering multiplexor and serializing circuitry.

2. Description of the Related Art

Figure 1A:
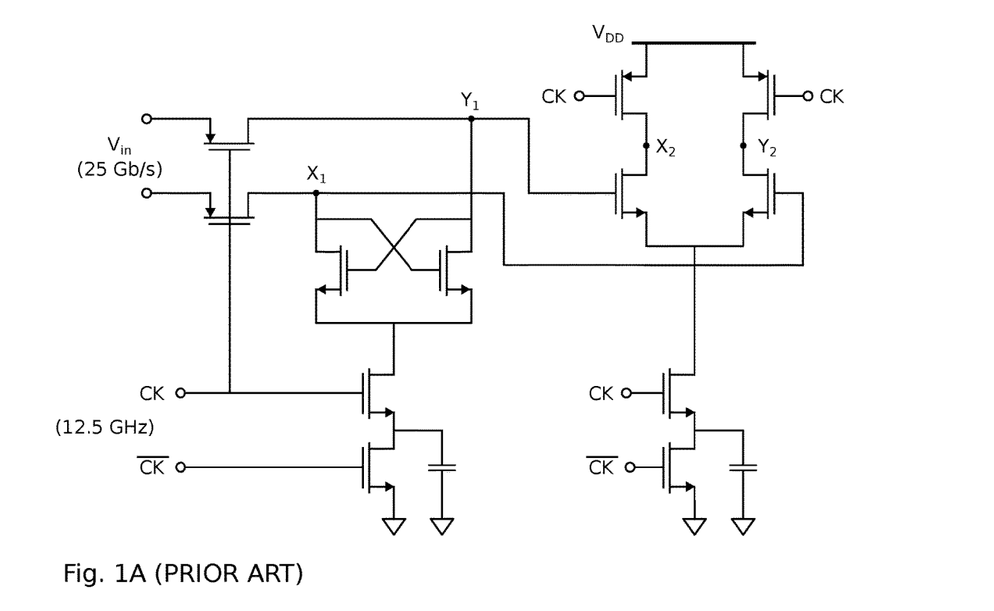
FIGS. 1A and 1B are, respectively, schematic diagrams of a charge-steering (CS) latch and CS multiplexor (prior art).
Figure 1B:
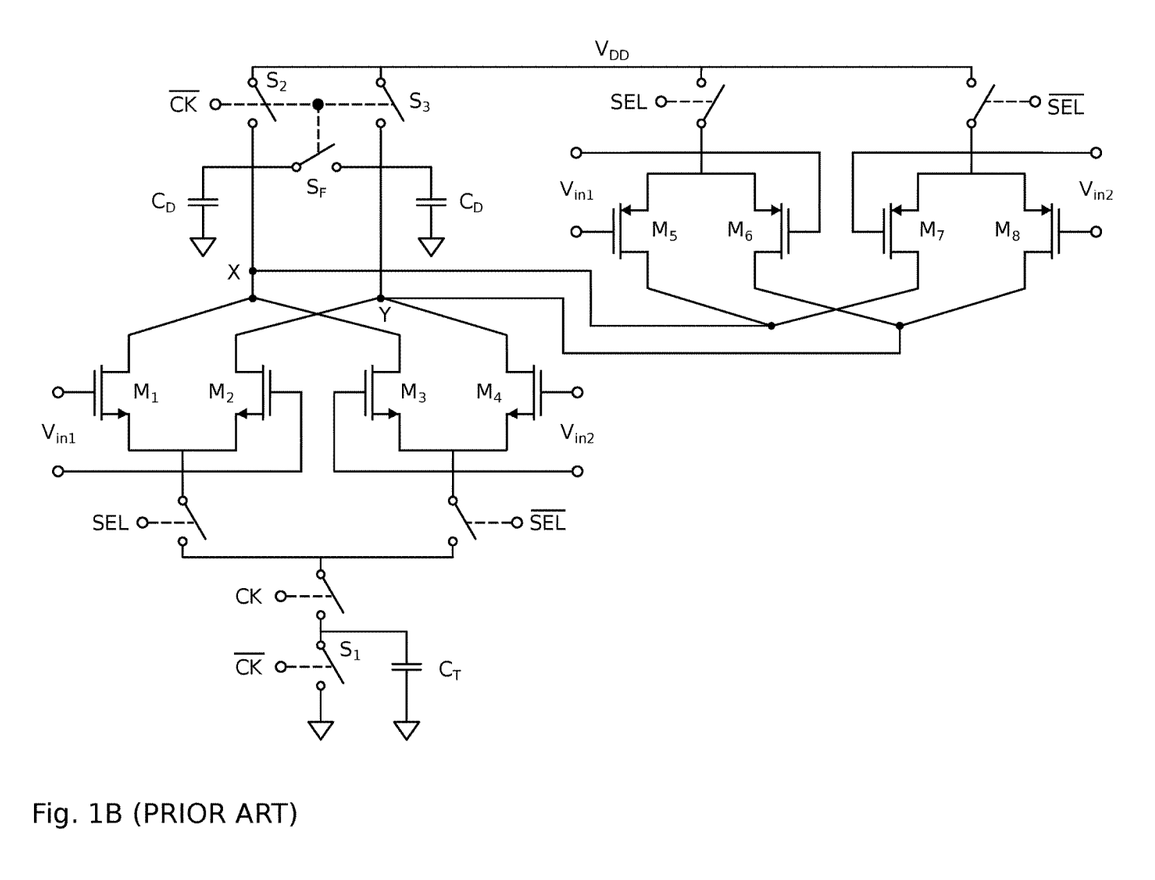

FIGS. 1A and 1B are, respectively, schematic diagrams of a charge-steering (CS) latch and CS multiplexor (prior art). CS logic operates with half of the voltage swing of conventional complementary metal-oxide-semiconductor (CMOS), leading to higher speeds and potentially large power savings.

It would be advantageous if conventional CMOS logic could be replaced with charge-steering logic, especially in the context of a high-speed serializer/deserializer (SerDes) transmitter (TX).

REFERENCES

1. Razavi, B. Charge steering: A low-power design paradigm. Proceedings of the IEEE Custom Integrated Circuits Conference, 2013.
2. Chang, Y., Manian, A., Kong, L. and Razavi, B. An 80-Gb/s 44-mW Wireline PAM4 Transmitter. IEEE Journal of Solid State Circuits, 2018.
3. Chang, Y., Manian, A., Kong, L. and Razavi, B. A 32-mW 40-Gb/s CMOS NRZ Transmitter. IEEE Custom Integrated Circuits Conference (CICC), 2018.
4. Razavi, B. Design of Integrated Circuits for Optical Communication Systems. McGraw-Hill, 2003.

SUMMARY OF THE INVENTION

Disclosed herein is circuitry that extends the charge-steering (CS) logic library with a 2:1 CS-multiplexor (MUX) cell that can be used in a tree fashion to compose a $2^N$:1 CS-MUX. Also presented is the integration of $2^N$:1 CS-MUX with conventional CMOS signals at a parallel input, and a current-mode driver at the serialized output.

Figures 2A, 2B, 2C:
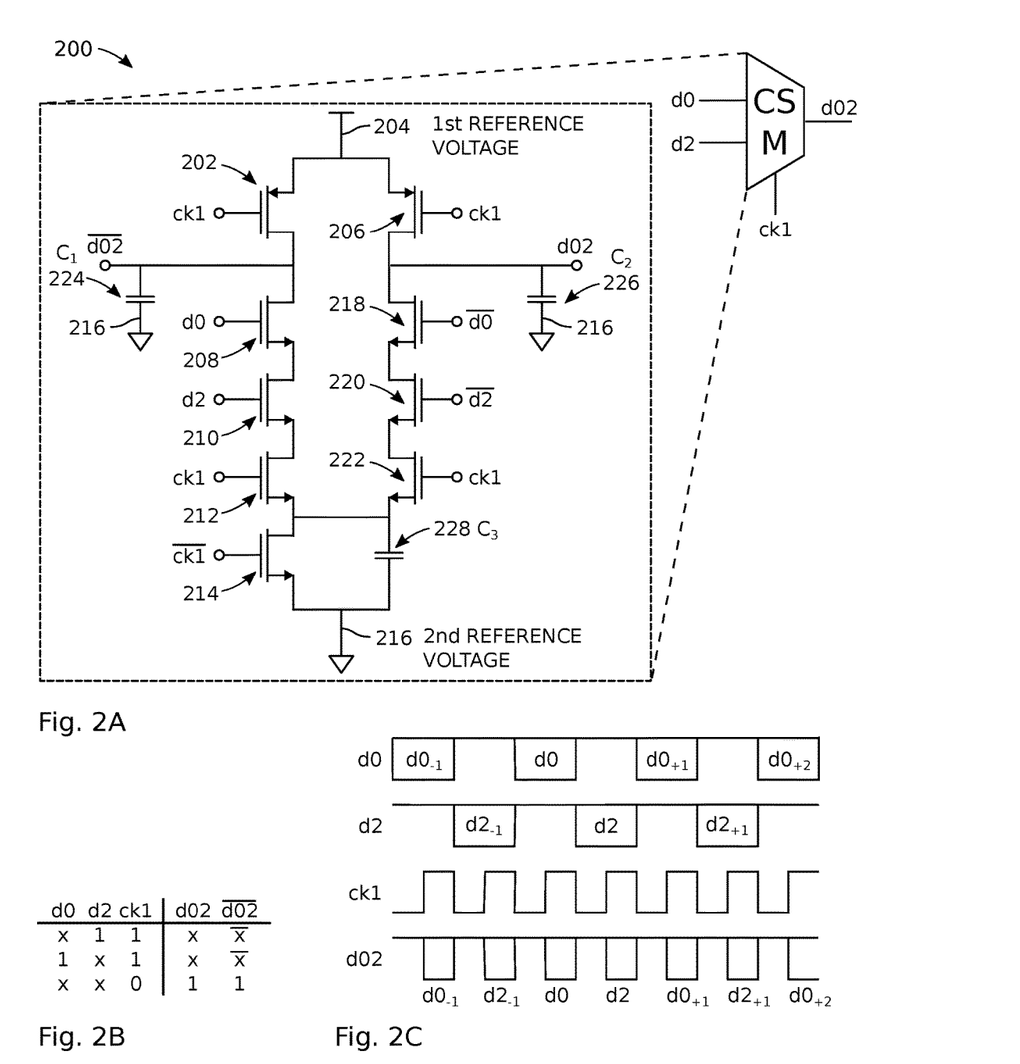
FIGS. 2A through 2C are, respectively, a schematic diagram, truth table, and signal timing diagram of a charge-steering multiplexor (CSM) comprising at least a first 2:1 multiplexor (MUX).

Accordingly, a charge-steering multiplexor (CSM) is presented that includes at least a first 2:1 multiplexor (MUX). The first 2:1 MUX is made up of the following components, see FIG. 2A: A first p-channel metal-oxide-semiconductor field effect transistor (PMOS) has a first source/drain (S/D) connected to a first reference voltage (e.g., $V_{DD}$), a gate to accept a first clock signal (ck1), and a second S/D;

A second PMOS has a first S/D connected to the first reference voltage, a gate to accept the first clock signal, and a second S/D;

A first n-channel metal-oxide-semiconductor field effect transistor (NMOS) has a first S/D connected to the second S/D of the first PMOS, a gate to accept a binary level first parallel return-to-zero (RZ) digital signal (d0), and a second S/D;

A second NMOS has a first S/D connected to the second S/D of the first NMOS, a gate to accept a binary level second parallel RZ digital signal (d2), and a second S/D;

A third NMOS has a first S/D connected to the second S/D of the second NMOS, a gate to accept the first clock signal, and a second S/D;

A fourth NMOS has a first S/D connected to the second S/D of the third NMOS, a gate to accept an inverted first clock signal (ck1_bar), and a second S/D connected to a second reference voltage having a lower potential than the first reference voltage; A fifth NMOS has a first S/D connected to the second S/D of the second PMOS, a gate to accept an inverted first parallel RZ digital signal (d0_bar), and a second S/D;

A sixth NMOS has a first S/D connected to the second S/D of the fifth NMOS, a gate to accept an inverted second parallel RZ digital signal (d2_bar), and a second S/D;

A seventh NMOS has a first S/D connected to the second S/D of the sixth NMOS, a gate to accept the first clock signal, and a second S/D connected to a second S/D of the third NMOS;

A first capacitor (C1) has a first terminal connected to the second S/D of the first PMOS to supply a binary level inverted first serial RZ digital signal (d02_bar), and a second terminal connected to the second reference voltage (e.g., ground);

A second capacitor (C2) has a first terminal connected to the second S/D of the second PMOS to supply a binary level first serial RZ digital signal (d02), and a second terminal connected to the second reference voltage; and, A third capacitor (C3) has a first terminal connected to the second S/D of the third NMOS and a second terminal connected to the second reference voltage.

In addition, described below are a 4:1 MUX, a non-return-to-zero (NRZ) to RZ serializing transmitter, a CSM pre-driver, and a CSM transmitter.

DETAILED DESCRIPTION

FIGS. 2A through 2C are, respectively, a schematic diagram, truth table, and signal timing diagram of a charge-steering multiplexor (CSM) comprising at a least first 2:1 multiplexor (MUX). The first 2:1 MUX 200 comprises a first p-channel metal-oxide-semiconductor field effect transistor (PMOS) 202 having a first source/drain (S/D) connected to a first reference voltage (e.g., $V_{DD}$) on line 204, a gate to accept a first clock signal (ck1), and a second S/D. A second PMOS 206 has a first S/D connected to the first reference voltage on line 204, a gate to accept the first clock signal, and a second S/D.

A first n-channel metal-oxide-semiconductor field effect transistor (NMOS) 208 has a first S/D connected to the second S/D of the first PMOS 202, a gate to accept a binary level first parallel return-to-zero (RZ) digital signal (d0), and a second S/D. A second NMOS 210 has a first S/D connected to the second S/D of the first NMOS 208, a gate to accept a binary level second parallel RZ digital signal (d2), and a second S/D. A third NMOS 212 has a first S/D connected to the second S/D of the second NMOS 210, a gate to accept the first clock signal, and a second S/D. A fourth NMOS 214 has a first S/D connected to the second S/D of the third NMOS 212, a gate to accept an inverted first clock signal (ck1_bar), and a second S/D connected on line 216 to a second reference voltage having a lower potential than the first reference voltage. For example, if the first reference voltage has a positive potential, the second reference voltage may be a DC or AC ground, a positive DC voltage having a lower potential than the first reference voltage, or a negative DC voltage.

A fifth NMOS 218 has a first S/D connected to the second S/D of the second PMOS 206, a gate to accept an inverted first parallel RZ digital signal (d0_bar), and a second S/D. A sixth NMOS 220 has a first S/D connected to the second S/D of the fifth NMOS 218, a gate to accept an inverted second parallel RZ digital signal (d2_bar), and a second S/D. A seventh NMOS 222 has a first S/D connected to the second S/D of the sixth NMOS 220, a gate to accept the first clock signal, and a second S/D connected to a second S/D of the third NMOS 212.

A first capacitor (C1) 224 has a first terminal connected to the second S/D of the first PMOS 202 to supply a binary level inverted first serial RZ digital signal (d02_bar), and a second terminal connected to the second reference voltage on line 216. A second capacitor (C2) 226 has a first terminal connected to the second S/D of the second PMOS 206 to supply a binary level first serial RZ digital signal (d02), and a second terminal connected to the second reference voltage on line 216. A third capacitor (C3) 228 has a first terminal connected to the second S/D of the third NMOS 212 and a second terminal connected to the second reference voltage on line 216.

The circuit operates as follows: when ck1 goes low, capacitances C1 and C2 are charged to the first reference voltage (e.g., $V_{DD}$) and C3 is charged to the second reference voltage (e.g., GND). When ck1 goes high, either C1 or C2 is discharged into C3, depending on the input signals d0 and d2. Since d0 and d2 are never low simultaneously, the output equals whichever input is active, at twice the data rate (re-timed by the ck1 clock). Both inputs and outputs use RZ signaling, where the data is available during half of the clock period and reset to $V_{DD}$ during the other half. It should also be understood that the block diagrams and signals timing waveforms presented herein are simplified representations of single-ended signals. In practice these signals are all differential, as is clear in the schematics.

Figure 3A:
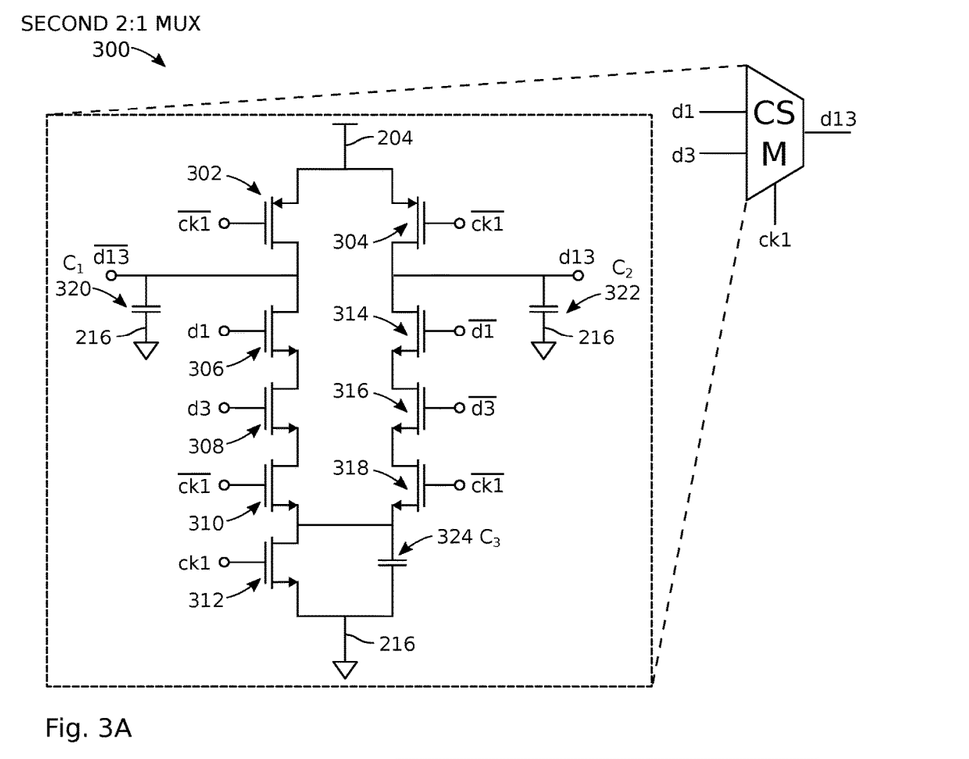
FIGS. 3A through 3C are, respectively, a schematic diagram, truth table, and signal timing diagram of the CSM comprising a second 2:1 MUX.
Figure 3B:
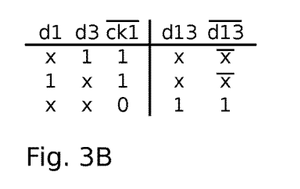
Figure 3C:
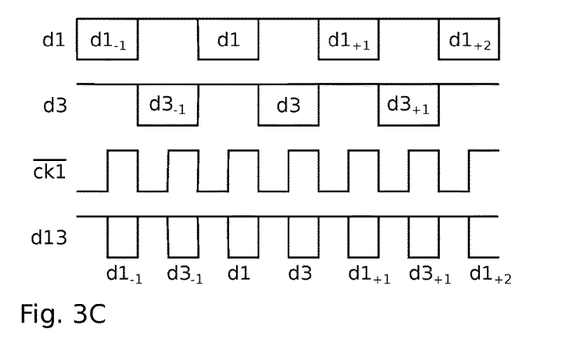

FIGS. 3A through 3C are, respectively, a schematic diagram, truth table, and signal timing diagram of the CSM comprising a second 2:1 MUX. As explained below, the first 2:1 MUX of FIG. 2A and the second 2:1 MUX 300 of FIG. 3A may be components of a 4:1 MUX. The second 2:1 MUX 300 comprises a first PMOS 302 having a first S/D connected to a first reference voltage on line 204, a gate to accept the first inverted clock signal (ck1_bar), and a second S/D. A second PMOS 304 has a first S/D connected to the first reference voltage on line 204, a gate to accept the first inverted clock signal, and a second S/D.

Figure 4A:
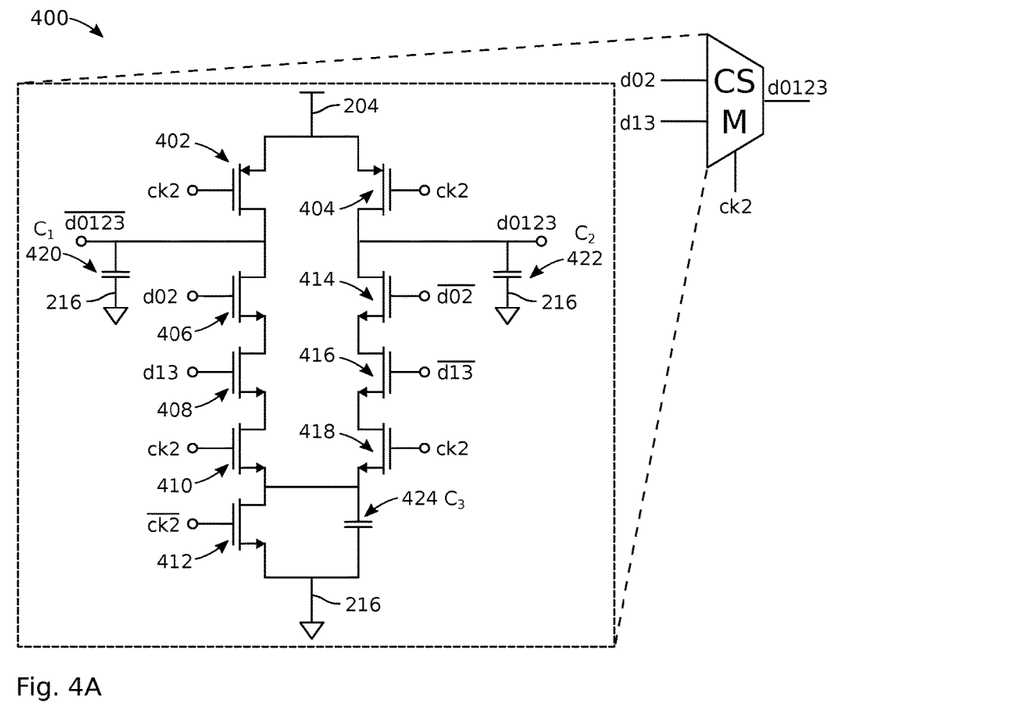
FIGS. 4A and 4B are, respectively, a schematic diagram and truth table of the CSM comprising a third 2:1 MUX.
Figure 4B:
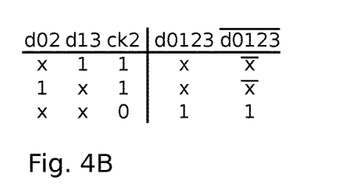
Figure 4C:
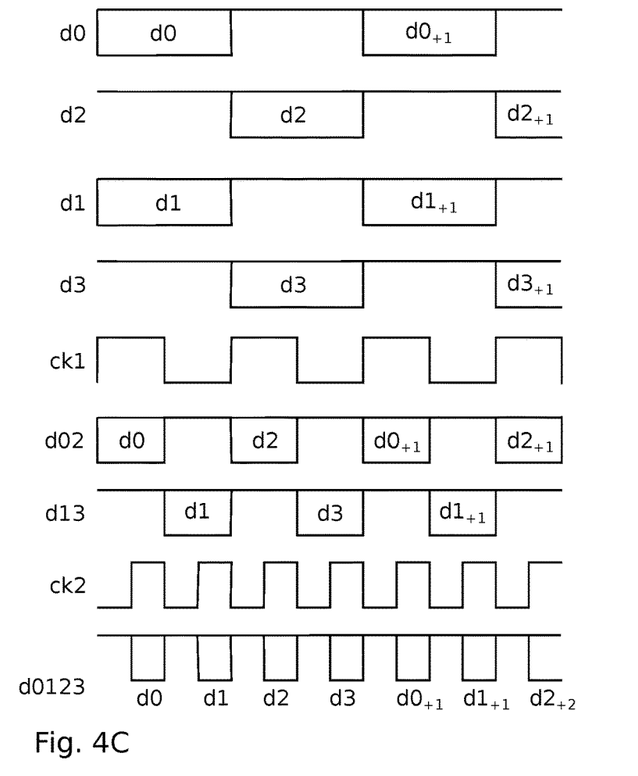
FIGS. 4C and 4D are, respectively, the signal timing diagram and schematic block diagram for the 4:1 MUX of FIG. 4A.

A first NMOS 306 has a first S/D connected to the second S/D of the first PMOS 302, a gate to accept a binary level third parallel RZ digital signal (d1) in phase with the first parallel RZ digital signal (d0), see FIG. 4C, and a second S/D. A second NMOS 308 has a first S/D connected to the second S/D of the first NMOS 306, a gate to accept a binary level fourth parallel RZ digital signal (d3) in phase with the second parallel RZ digital signal (d2), and a second S/D. A third NMOS 310 has a first S/D connected to the second S/D of the second NMOS 308, a gate to accept the first inverted clock signal, and a second S/D. A fourth NMOS 312 has a first S/D connected to the second S/D of the third NMOS 310, a gate to accept the first clock signal, and a second S/D connected to the second reference voltage on line 216.

A fifth NMOS 314 has a first S/D connected to the second S/D of the second PMOS 304, a gate to accept a binary level inverted third parallel RZ digital signal (d1_bar), and a second S/D. A sixth NMOS 316 has a first S/D connected to the second S/D of the fifth NMOS 314, a gate to accept a binary level inverted fourth parallel RZ digital signal (d3_bar), and a second S/D. A seventh NMOS 318 has a first S/D connected to the second S/D of the sixth NMOS 316, a gate to accept the first inverted clock signal, and a second S/D connected to a second S/D of the third NMOS 310.

A first capacitor (C1) 320 has a first terminal connected to the second S/D of the first PMOS 302 to supply a binary level inverted second serial RZ digital signal (d13_bar) complementary in phase to the first serial RZ digital signal (d02), and a second terminal connected to the second reference voltage on line 216. A second capacitor (C2) 322 has a first terminal connected to the second S/D of the second PMOS 304 to supply a binary level second serial RZ digital signal (d13), and a second terminal connected to the second reference voltage on line 216. A third capacitor (C3) 324 has a first terminal connected to the second S/D of the third NMOS 310 and a second terminal connected to the second reference voltage on line 216.

FIGS. 4A and 4B are, respectively, a schematic diagram and truth table of the CSM comprising a third 2:1 MUX. The combination of the first 2:1 MUX, second 2:1 MUX, and third 2:1 MUX 400 comprise a 4:1 MUX. The third 2:1 MUX 400 comprises a first PMOS 402 having a S/D connected to a first reference voltage on line 204, a gate to accept a second clock signal (ck2), and a second S/D. The clock rate of the second clock signal is twice that of the first clock signal (ck1), and in phase with the first clock signal. Typically, the second clock is derived from the first clock, or the first clock is derived from the second clock. A second PMOS 404 has a first S/D connected to the first reference voltage on line 204, a gate to accept the second clock signal, and a second S/D.

A first NMOS 406 has a first S/D connected to the second S/D of the first PMOS 402, a gate to accept the first serial RZ digital signal (d02), and a second S/D. A second NMOS 408 has a first S/D connected to the second S/D of the first NMOS 406, a gate to accept the second serial RZ digital signal (d13), and a second S/D. A third NMOS 410 has a first S/D connected to the second S/D of the second NMOS 408, a gate to accept the second clock signal, and a second S/D.

A fourth NMOS 412 has a first S/D connected to the second S/D of the third NMOS 410, a gate to accept an inverted second clock signal (ck2_bar), and a second S/D connected to the second reference voltage on line 216.

A fifth NMOS 414 has a first S/D connected to the second S/D of the second PMOS 404, a gate to accept the inverted first serial RZ digital signal (d02_bar), and a second S/D. A sixth NMOS 416 has a first S/D connected to the second S/D of the fifth NMOS 414, a gate to accept an inverted second serial RZ digital signal (d13_bar), and a second S/D. A seventh NMOS 418 has a first S/D connected to the second S/D of the sixth NMOS 416, a gate to accept the second clock signal, and a second S/D connected to a second S/D of the third NMOS 410.

A first capacitor (C1) 420 has a first terminal connected to the second S/D of the first PMOS 402 to supply a binary level inverted third serial RZ digital signal (d0123_bar), and a second terminal connected to the second reference voltage on line 216. A second capacitor (C2) 422 has a first terminal connected to the second S/D of the second PMOS 404 to supply a binary level third serial RZ digital signal (d0123), and a second terminal connected to the second reference voltage on line 216. A third capacitor (C3) 424 has a first terminal connected to the second S/D of the third NMOS 410 and a second terminal connected to the second reference voltage on line 216.

Figure 4D:
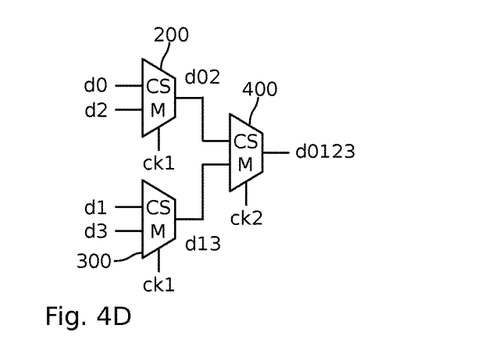

FIGS. 4C and 4D are, respectively, the signal timing diagram and schematic block diagram for the 4:1 MUX of FIG. 4A. Although not explicitly shown, it would be understood by one with skill in the art that two 4:1 MUXs may be combined in parallel to create a 8:1 MUX, and extended further in like manner to create $2^N$:1 MUXs.

Figure 5A:
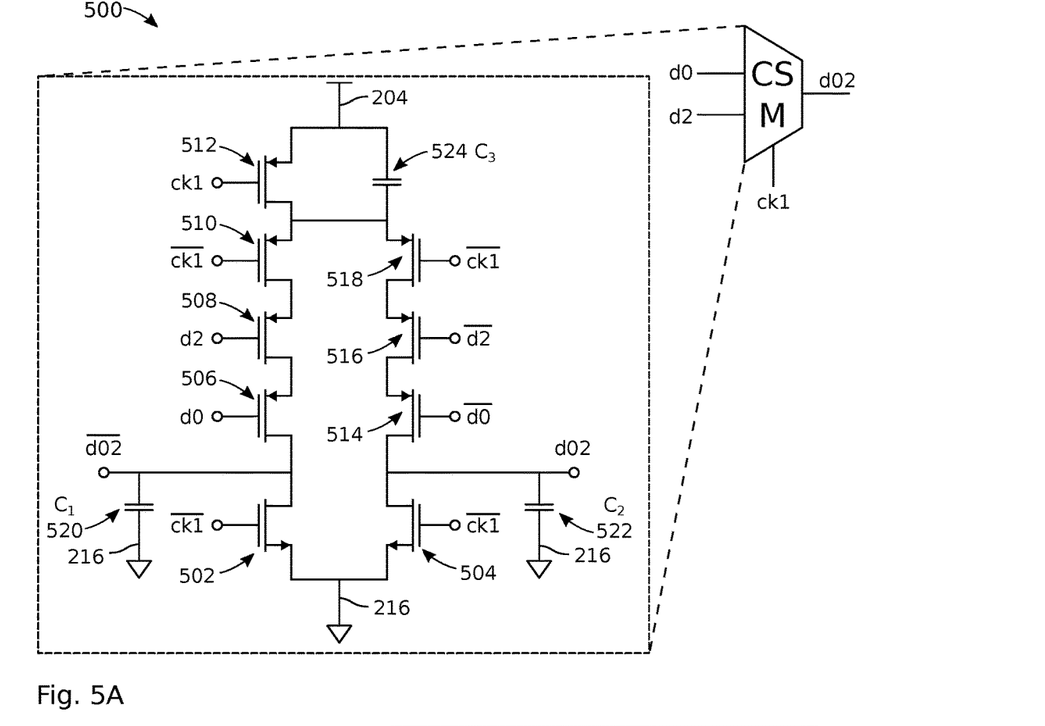
FIGS. 5A through 5C are, respectively, a schematic diagram, truth table, and signal timing diagram of a CSM variation using the second reference voltage as the RZ voltage.
Figure 5B:
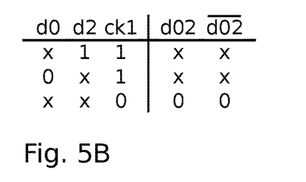
Figure 5C:
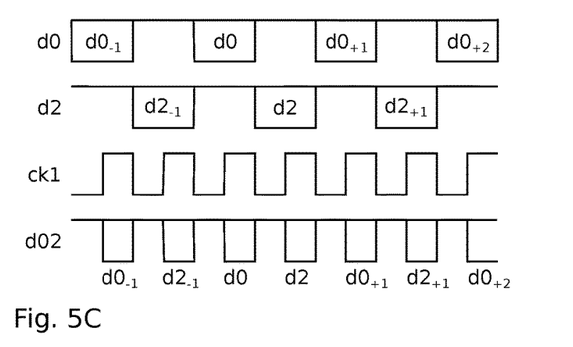

FIGS. 5A through 5C are, respectively, a schematic diagram, truth table, and signal timing diagram of a CSM variation using the second reference voltage as the RZ voltage. The MUXs of FIGS. 2A, 3A, and 4A use the first reference voltage (e.g., $V_{DD}$) as the RZ voltage. In contrast, the 2:1 MUX of FIG. 5A use the second reference (e.g., ground) as the RZ voltage. In short, the second reference voltage can be made the RZ node by using PMOS transistors at the input of the CSM cells, and PMOS for the reset switches, as would be understood by one with skill in the art.

In this variation the CSM 2:1 MUX 500 comprises a first NMOS 502 having a first S/D, a gate to accept an inverted first clock signal (ck1_bar), and a second S/D connected to the second reference voltage on line 216. A second NMOS 504 has a first S/D, a gate to accept the inverted first clock signal, and a second S/D connected to the second reference voltage on line 216.

A first PMOS 506 has a first S/D, a gate to accept a binary level first parallel return-to-zero (RZ) digital signal (d0), and a second S/D connected to the first S/D of the first NMOS 502. A second PMOS 508 has a first S/D, a gate to accept a binary level second parallel RZ digital signal (d2), and a second S/D connected to the first S/D of the first PMOS 506. A third PMOS 510 has a first S/D, a gate to accept the inverted first clock signal, and a second S/D connected to the first S/D of the second PMOS 508. A fourth PMOS 512 has a first S/D connected to the first reference voltage on line 204, which has a higher potential than the second reference voltage. The fourth PMOS 512 has a gate to accept the first clock signal (ck1), and a second S/D connected to the first S/D of the third PMOS 510.

A fifth PMOS 514 has a first S/D, a gate to accept a binary level inverted first parallel RZ digital signal (d0_bar), and a second S/D connected to the first S/D of the second NMOS 504. A sixth PMOS 516 has a first S/D, a gate to accept a binary level inverted second parallel RZ digital signal (d2_bar), and a second S/D connected to the first S/D of the fifth PMOS 514. A seventh PMOS 518 has a first S/D connected to the first S/D of the third PMOS 510, a gate to accept the inverted first clock signal, and a second S/D connected to the first S/D of the sixth PMOS 516.

A first capacitor (C1) 520 has a first terminal connected to the first S/D of the first NMOS 502 to supply a binary level inverted serial RZ digital signal (d02_bar), and a second terminal connected to the second reference voltage on line 216. A second capacitor (C2) 522 has a first terminal connected to the first S/D of the second NMOS 504 to supply a binary level serial RZ digital signal (d02), and a second terminal connected to the second reference voltage on line 216. A third capacitor (C3) 524 has a first terminal connected to the first reference voltage on line 204, and a second terminal connected to the first S/D of the third PMOS 510.

In the interest of brevity, and therefore not explicitly shown, one with skill in the art would understand a second 2:1 MUX using the second reference voltage as the RZ voltage can also be made by inverting the clock signals mentioned above, similar to the relationship between the MUX of FIG. 2A and the MUX of FIG. 3A as a model. Likewise, two such MUXs can be combined to make a 4:1 MUX, with the concept extended to make $2^N$:1 MUXs.

Figure 6A:
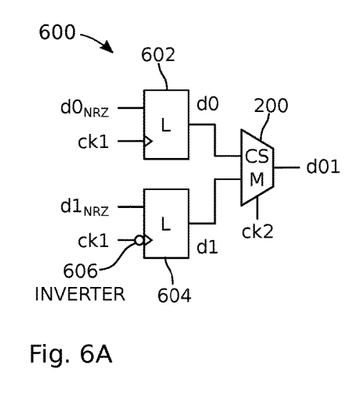
FIGS. 6A and 6B are, respectively, a schematic block diagram and signal timing diagram for a non-return-to-zero (NRZ)-to-RZ serializing transmitter.
Figure 6B:
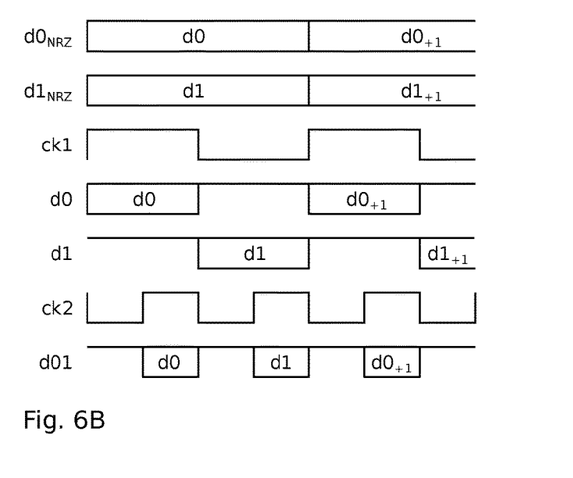

FIGS. 6A and 6B are, respectively, a schematic block diagram and signal timing diagram for a non-return-to-zero (NRZ)-to-RZ serializing transmitter. The transmitter 600 comprises a first latch 602 having an input to receive a binary level first parallel NRZ digital signal (d0$_{NRZ}$), an input to receive a first clock (ck1), and an output to supply a binary level first parallel RZ digital signal (d0). The latch 602 may be enabled using the circuitry depicted in FIG. 1 for example. However, the transmitter is not limited to any particular technology capable of converting NRZ to RZ signals. A second latch 604 has an input to receive a binary level second parallel NRZ digital signal (d1$_{NRZ}$), an input to receive the first clock (ck1), and an output to supply a binary level second parallel RZ digital signal (d1). The operation of the second latch 604 on opposite phases of the clock, as compared to the first latch 602, is represented through the depiction of inverter 606.

The CSM 200 is identical to the CSM of FIG. 2A, except that instead of using the first clock (ck1), second clock (ck2) is used, which is in phase with the first clock, but running at twice the clock rate. In the interest of brevity, the description of CSM 200 is not repeated here.

Figure 7:
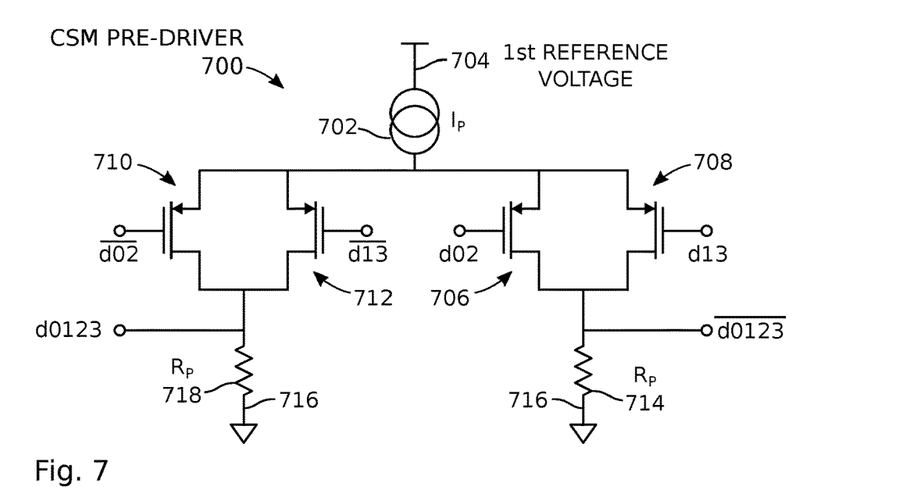
FIG. 7 is a schematic drawing of a CSM pre-driver.

FIG. 7 is a schematic drawing of a CSM pre-driver. The CSM pre-driver 700 comprises a current source 702 having a first terminal connected to a first reference voltage on line 704 and a second terminal. There are many types of circuit designs that are well known in the art that can be used to enable current source 702. A first PMOS 706 has a first S/D connected to the second terminal of the current source 702, a gate to accept a binary level first RZ digital signal (d02), and a second S/D. A second PMOS 708 has a first S/D connected to the second terminal of the current source 702, a gate to accept a binary level second serial RZ digital signal (d13), and a second S/D.

A third PMOS 710 has a first S/D connected to the second terminal of the current source 702, a gate to accept a binary level inverted first serial RZ digital signal (d02_bar), and a second S/D. A fourth PMOS 712 has a first S/D connected to the second terminal of the current source 702, a gate to accept a binary level inverted second serial RZ digital signal (d13_bar), and a second S/D. A first load 714, represented as a resistor for simplicity, has a first terminal connected to the second S/D of the second PMOS 708 to supply a binary level inverted third serial NRZ digital signal (d0123_bar), and a second terminal connected to a second reference voltage on line 716 having a lower potential than the first reference voltage. The load 714 may also include both resistive and non-resistive impedances. A second load 718 has a first terminal connected to the second S/D of the fourth PMOS 712 to supply a binary level third serial NRZ digital signal (d0123), and a second terminal connected to the second reference voltage on line 716.

Figure 8A:
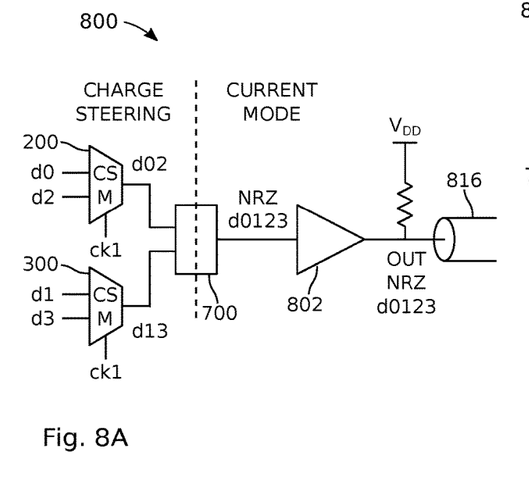
FIGS. 8A and 8B are, respectively, a schematic block diagram and signal timing diagram for another variation of the CSM transmitter.
Figure 8B:
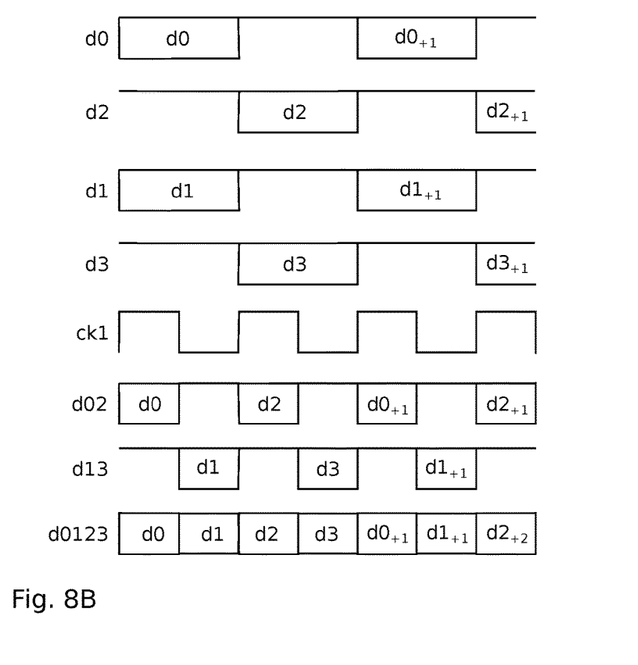
Figure 8C:
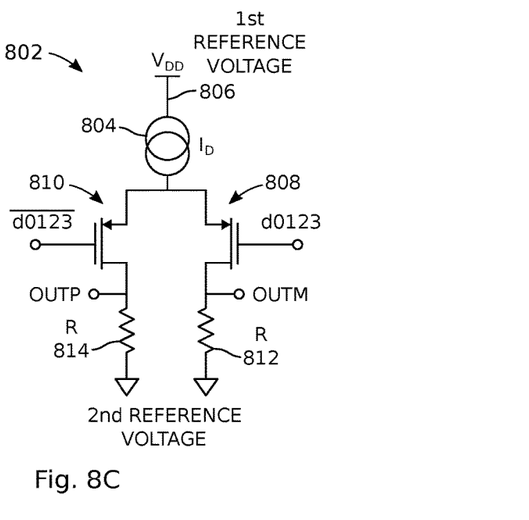
FIG. 8C is a schematic diagram of a current-mode (CM) driver.

FIGS. 8A and 8B are, respectively, a schematic block diagram and signal timing diagram for another variation of the CSM transmitter, and FIG. 8C is a schematic diagram of a current-mode (CM) driver. The CSM transmitter 800 comprises a first 2:1 MUX 200 as depicted in FIG. 2A and a second 2:1 MUX 300 as depicted in FIG. 3A. The first 2:1 MUX 200 supplies first serial RZ digital signals (d02) and (d02_bar). For simplicity d02 is shown as a single-ended signal although the 2:1 MUX actually supplies a differential signal. The second 2:1 MUX 300 supplies second serial RZ digital signals (d13) and (d13_bar). Again for simplicity only d13 is shown as a single-ended signal. Second serial RZ digital signals d13 are complementary in phase to the first serial RZ digital signals d02.

The pre-driver 700 comprises the circuitry components depicted in schematic of FIG. 7. The pre-driver 700 accepts the first serial RZ digital signal (d02), the second serial RZ digital signal (d13), the inverted first serial RZ digital signal (d02_bar), and the inverted second serial RZ digital signal (d13_bar). The pre-driver 700 supplies the third inverted serial NRZ digital signal (d0123_bar) and the third serial NRZ digital signal (d0123). For simplicity, only signal d0123 is shown as a single-ended signal. The CSM transmitter may further comprise driver circuit 802.

As shown in FIG. 8C, the driver 802 comprises a second current source 804 having a first terminal connected to the first reference voltage on line 806. Note: the "first" current source resides in the pre-driver. The driver 802 further comprises a seventh PMOS 808 having a first S/D connected to the second terminal of the second current source 804, a gate to accept the third serial NRZ digital signal (d0123), and a second S/D. Note: the "sixth" PMOS resides in the second 2:1 MUX. An eighth PMOS 810 has a first S/D connected to the second terminal of the second current source 804, a gate to accept the third inverted serial NRZ digital signal (d0123_bar), and a second S/D. A third load 812 has a first terminal connected to the second S/D of the seventh PMOS 808 to supply an amplified inverted third NRZ digital signal, and a second terminal connected to the second reference voltage having a lower potential than the first reference voltage. Note: the "second" load resides in the pre-driver 700. As in the pre-driver, a load may include both resistive and non-resistive impedances. A fourth load 814 has a first terminal connected to the second S/D of the eighth PMOS to supply an amplified third NRZ digital signal, and a second terminal connected to the second reference voltage.

The final stage of serializers often includes a high-power current-mode transmitter that drives a 50 ohm transmission line off-chip. The driver 802 typically has large input capacitance when compared to the logic cells, and is preferably driven by a pre-driver that has sufficient bandwidth. The CSM transmitter of FIG. 8A is an example of a 4:1 serializer where the final 2:1 serialization is performed by the pre-driver 700, which also serves as a buffer.

Figure 9A:
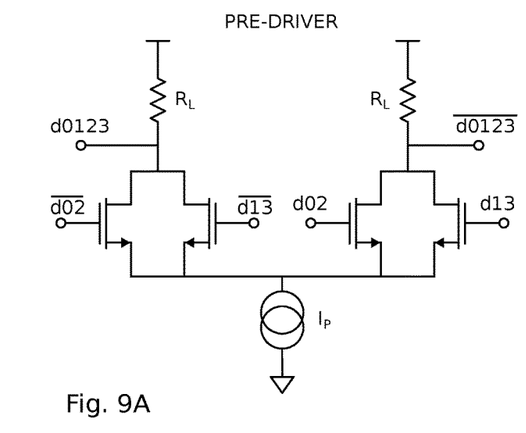
FIGS. 9A and 9B are schematic diagrams respectively depicting a pre-driver and driver enabled for use with circuitry using the second reference voltage as the RZ voltage.
Figure 9B:
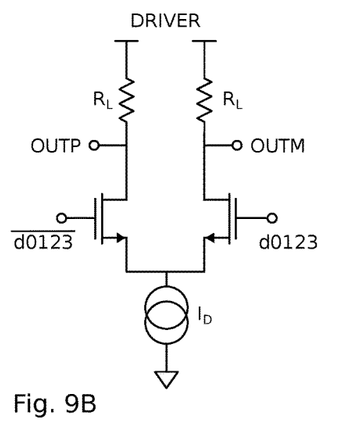

FIGS. 9A and 9B are schematic diagrams respectively depicting a pre-driver and driver enabled for use with circuitry using the second reference voltage as the RZ voltage. In short, the second reference voltage (e.g., ground) can be made the RZ node by using NMOS transistors, instead of PMOS, in the CM pre-driver and driver cells, as would be understood by one with skill in the art.

Figure 10:
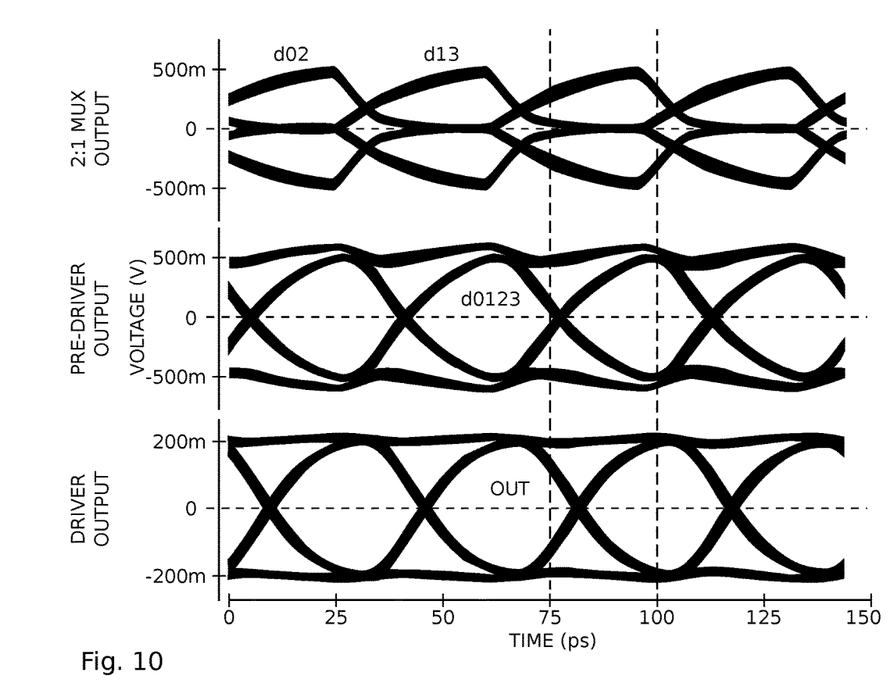
FIG. 10 are simulation waveforms of a hardware implementation of the circuit of FIG. 8A in 14 nanometer (nm) FinFET CMOS with full data-rate of 28 gigabits per second (Gbps).

FIG. 10 are simulation waveforms of a hardware implementation of the circuit of FIG. 8A in 14 nanometer (nm) FinFET CMOS with full data-rate of 28 gigabits per second (Gbps). One advantage of using a CM driver is the merging of the driver and 2:1 MUX, eliminating the need for a full-rate clock. All the logic operates with reduced swing, saving power. CM drivers also achieve higher bandwidths than their voltage-mode counterparts.

Current-charging circuitry has been presented for the purposes of multiplexing and serializing digital data streams. The invention should not be understood to be limited to merely the examples presented herein. Other variations and embodiments of the invention will occur to those skilled in the art.

I claim:

1. A charge-steering multiplexor (CSM) comprising a first 2:1 multiplexor (MUX), wherein the first 2:1 MUX comprises:

a first p-channel metal-oxide-semiconductor field effect transistor (PMOS) having a first source/drain (S/D) connected to a first reference voltage, a gate to accept a first clock signal (ck1), and a second S/D;

a second PMOS having a first S/D connected to the first reference voltage, a gate to accept the first clock signal, and a second S/D;

a first n-channel metal-oxide-semiconductor field effect transistor (NMOS) having a first S/D connected to the second S/D of the first PMOS, a gate to accept a binary level first parallel return-to-zero (RZ) digital signal (d0), and a second S/D;

a second NMOS having a first S/D connected to the second S/D of the first NMOS, a gate to accept a binary level second parallel RZ digital signal (d2), and a second S/D;

a third NMOS having a first S/D connected to the second S/D of the second NMOS, a gate to accept the first clock signal, and a second S/D;

a fourth NMOS having a first S/D connected to the second S/D of the third NMOS, a gate to accept an inverted first clock signal (ck1_bar), and a second S/D connected to a second reference voltage having a lower potential than the first reference voltage;

a fifth NMOS having a first S/D connected to the second S/D of the second PMOS, a gate to accept an inverted first parallel RZ digital signal (d0_bar), and a second S/D;

a sixth NMOS having a first S/D connected to the second S/D of the fifth NMOS, a gate to accept an inverted second parallel RZ digital signal (d2_bar), and a second S/D;

a seventh NMOS having a first S/D connected to the second S/D of the sixth NMOS, a gate to accept the first clock signal, and a second S/D connected to the second S/D of the third NMOS;

a first capacitor (C1) having a first terminal connected to the second S/D of the first PMOS to supply a binary level inverted first serial RZ digital signal (d02_bar), and a second terminal connected to the second reference voltage;

a second capacitor (C2) having a first terminal connected to the second S/D of the second PMOS to supply a binary level first serial RZ digital signal (d02), and a second terminal connected to the second reference voltage; and, a third capacitor (C3) having a first terminal connected to the second S/D of the third NMOS and a second terminal connected to the second reference voltage.

2. The CSM of claim 1 further comprising a second 2:1 MUX, the second 2:1 MUX comprising:

a first PMOS having a first S/D connected to the first reference voltage, a gate to accept the first inverted clock signal (ck1_bar), and a second S/D;

a second PMOS having a first S/D connected to the first reference voltage, a gate to accept the first inverted clock signal, and a second S/D;

a first NMOS having a first S/D connected to the second S/D of the first PMOS of the second 2:1 MUX, a gate to accept a binary level third parallel RZ digital signal (d1) in phase with the first parallel RZ digital signal (d0), and a second S/D;

a second NMOS having a first S/D connected to the second S/D of the first NMOS of the second 2:1 MUX, a gate to accept a binary level fourth parallel RZ digital signal (d3) in phase with the second parallel RZ digital signal (d2), and a second S/D;

a third NMOS having a first S/D connected to the second S/D of the second NMOS of the second 2:1 MUX, a gate to accept the first inverted clock signal, and a second S/D;

a fourth NMOS having a first S/D connected to the second S/D of the third NMOS of the second 2:1 MUX, a gate to accept the first clock signal, and a second S/D connected to the second reference voltage;

a fifth NMOS having a first S/D connected to the second S/D of the second PMOS of the second 2:1 MUX, a gate to accept a binary level inverted third parallel RZ digital signal (d1_bar), and a second S/D;

a sixth NMOS having a first S/D connected to the second S/D of the fifth NMOS of the second 2:1 MUX, a gate to accept a binary level inverted fourth parallel RZ digital signal (d3_bar), and a second S/D;

a seventh NMOS having a first S/D connected to the second S/D of the sixth NMOS of the second 2:1 MUX, a gate to accept the first inverted clock signal, and a second S/D connected to the second S/D of the third NMOS of the second 2:1 MUX;

a first capacitor (C1) having a first terminal connected to the second S/D of the first PMOS of the second 2:1 MUX to supply a binary level inverted second serial RZ digital signal (d13_bar) complementary in phase to the first serial RZ digital signal (d02), and a second terminal connected to the second reference voltage;

a second capacitor (C2) having a first terminal connected to the second S/D of the second PMOS of the second 2:1 MUX to supply a binary level second serial RZ digital signal (d13), and a second terminal connected to the second reference voltage;

a third capacitor (C3) having a first terminal connected to the second S/D of the third NMOS of the second 2:1 MUX and a second terminal connected to the second reference voltage;

the CSM further comprising a third 2:1 MUX, the third 2:1 MUX comprising:

a first PMOS having a first S/D connected to the first reference voltage, a gate to accept a second clock signal (ck2), and a second S/D, where the clock rate of the second clock signal is twice that of the first clock signal;

a second PMOS having a first S/D connected to the first reference voltage, a gate to accept the second clock signal, and a second S/D;

a first NMOS having a first S/D connected to the second S/D of the first PMOS of the second 2:1 MUX, a gate to accept the first serial RZ digital signal (d02), and a second S/D;

a second NMOS having a first S/D connected to the second S/D of the first NMOS of the second 2:1 MUX, a gate to accept the second serial RZ digital signal (d13), and a second S/D;

a third NMOS having a first S/D connected to the second S/D of the second NMOS of the second 2:1 MUX, a gate to accept the second clock signal, and a second S/D;

a fourth NMOS having a first S/D connected to the second S/D of the third NMOS of the second 2:1 MUX, a gate to accept an inverted second clock signal (ck2_bar), and a second S/D connected to the second reference voltage;

a fifth NMOS having a first S/D connected to the second S/D of the second PMOS of the second 2:1 MUX, a gate to accept the inverted first serial RZ digital signal (d02_bar), and a second S/D;

a sixth NMOS having a first S/D connected to the second S/D of the fifth NMOS of the second 2:1 MUX, a gate to accept an inverted second serial RZ digital signal (d13_bar), and a second S/D;

a seventh NMOS having a first S/D connected to the second S/D of the sixth NMOS of the second 2:1 MUX, a gate to accept the second clock signal, and a second S/D connected to the second S/D of the third NMOS of the second 2:1 MUX;

a first capacitor (C1) having a first terminal connected to the second S/D of the first PMOS of the second 2:1 MUX to supply a binary level inverted third serial RZ digital signal (d0123_bar), and a second terminal connected to the second reference voltage;

a second capacitor (C2) having a first terminal connected to the second S/D of the second PMOS of the second 2:1 MUX to supply a binary level third serial RZ digital signal (d0123), and a second terminal connected to the second reference voltage; and, a third capacitor (C3) having a first terminal connected to the second S/D of the third NMOS of the second 2:1 MUX and a second terminal connected to the second reference voltage.

3. A charge-steering multiplexor (CSM) comprising:

a first multiplexor (MUX) comprising:

a first n-channel metal-oxide-semiconductor field effect transistor (NMOS) having a first source/drain (S/D), a gate to accept a first inverted clock signal (ck1_bar), and a second S/D connected to a first reference voltage;

a second NMOS having a first S/D, a gate to accept the first inverted clock signal, and a second S/D connected to the first reference voltage;

a first p-channel metal-oxide-semiconductor field effect transistor (PMOS) having a first S/D, a gate to accept a binary level first parallel return-to-zero (RZ) digital signal (d0), and a second S/D connected to the first S/D of the first NMOS;

a second PMOS having a first S/D, a gate to accept a binary level second parallel RZ digital signal (d2), and a second S/D connected to the first S/D of the first PMOS;

a third PMOS having a first S/D, a gate to accept the first inverted clock signal, and a second S/D connected to the first S/D of the second PMOS;

a fourth PMOS having a first S/D connected to a second reference voltage having a higher potential than the first reference voltage, a gate to accept a first clock signal (ck1), and a second S/D connected to the first S/D of the third PMOS;

a fifth PMOS having a first S/D, a gate to accept a binary level inverted first parallel RZ digital signal (d0_bar), and a second S/D connected to the first S/D of the second NMOS;

a sixth PMOS having a first S/D, a gate to accept a binary level inverted second parallel RZ digital signal (d2_bar), and a second S/D connected to the first S/D of the fifth PMOS;

a seventh PMOS having a first S/D connected to the first S/D of the third PMOS, a gate to accept the first inverted clock signal, and a second S/D connected to the first S/D of the sixth PMOS;

a first capacitor (C1) having a first terminal connected to the first S/D of the first NMOS to supply a binary level inverted first serial RZ digital signal (d02_bar), and a second terminal connected to the first reference voltage;

a second capacitor (C2) having a first terminal connected to the first S/D of the second NMOS to supply a binary level first serial RZ digital signal (d02), and a second terminal connected to the first reference voltage; and, a third capacitor (C3) having a first terminal connected to the second reference voltage, and a second terminal connected to the first S/D of the third PMOS.

4. The CSM of claim 3 further comprising a second 2:1 MUX, the second 2:1 MUX comprising:

a first NMOS having a first S/D, a gate to accept the first clock signal (ck1), and a second S/D connected to the first reference voltage;

a second NMOS having a first S/D, a gate to accept the first clock signal, and a second S/D connected to the first reference voltage;

a first PMOS having a first S/D, a gate to accept a binary level third parallel RZ digital signal (d1), and a second S/D connected to the first S/D of the first NMOS of the second 2:1 MUX;

a second PMOS having a first S/D, a gate to accept a binary level fourth parallel RZ digital signal (d3), and a second S/D connected to the first S/D of the first PMOS of the second 2:1 MUX;

a third PMOS having a first S/D, a gate to accept the first clock signal, and a second S/D connected to the first S/D of the second PMOS of the second 2:1 MUX;

a fourth PMOS having a first S/D connected to the second reference voltage having a higher potential than the first reference voltage, a gate to accept the first inverted clock signal (ck1_bar), and a second S/D connected to the first S/D of the third PMOS of the second 2:1 MUX;

a fifth PMOS having a first S/D, a gate to accept a binary level inverted third parallel RZ digital signal (d1_bar), and a second S/D connected to the first S/D of the second NMOS of the second 2:1 MUX;

a sixth PMOS having a first S/D, a gate to accept a binary level inverted fourth parallel RZ digital signal (d3_bar), and a second S/D connected to the first S/D of the fifth PMOS of the second 2:1 MUX;

a seventh PMOS having a first S/D connected to the first S/D of the third PMOS of the second 2:1 MUX, a gate to accept the first clock signal, and a second S/D connected to the first S/D of the sixth PMOS of the second 2:1 MUX;

a first capacitor (C1) having a first terminal connected to the first S/D of the first NMOS of the second 2:1 MUX to supply a binary level inverted second serial RZ digital signal (d13_bar), and a second terminal connected to the first reference voltage;

a second capacitor (C2) having a first terminal connected to the first S/D of the second NMOS of the second 2:1 MUX to supply a binary level second serial RZ digital signal (d13), and a second terminal connected to the first reference voltage;

a third capacitor (C3) having a first terminal connected to the second reference voltage, and a second terminal connected to the first S/D of the third PMOS of the second 2:1 MUX;

the CSM further comprising a third 2:1 MUX, the third 2:1 MUX comprising:

a first NMOS having a first S/D, a gate to accept the second inverted clock signal (ck2_bar), and a second S/D connected to the first reference voltage, where the clock rate of the second clock signal is twice that of the first clock signal;

a second NMOS having a first S/D, a gate to accept the second inverted clock signal (ck2_bar), and a second S/D connected to the first reference voltage;

a first PMOS having a first S/D, a gate to accept the first serial RZ digital signal (d02), and a second S/D connected to the first S/D of the first NMOS of the second 2:1 MUX;

a second PMOS having a first S/D, a gate to accept the second serial RZ digital signal (d13), and a second S/D connected to the first S/D of the first PMOS of the second 2:1 MUX;

a third PMOS having a first S/D, a gate to accept the second inverted clock signal, and a second S/D connected to the first S/D of the second PMOS of the second 2:1 MUX;

a fourth PMOS having a first S/D connected to the second reference voltage, a gate to accept the second clock signal (ck2), and a second S/D connected to the first S/D of the third PMOS of the second 2:1 MUX;

a fifth PMOS having a first S/D, a gate to accept the inverted first serial RZ digital signal (d02_bar), and a second S/D connected to the first S/D of the second NMOS of the second 2:1 MUX;

a sixth PMOS having a first S/D, a gate to accept the inverted second serial RZ digital signal (d13_bar), and a second S/D connected to the first S/D of the fifth PMOS of the second 2:1 MUX;

a seventh PMOS having a first S/D connected to the first S/D of the third PMOS of the second 2:1 MUX, a gate to accept the second inverted clock signal, and a second S/D connected to the first S/D of the sixth PMOS of the second 2:1 MUX;

a first capacitor (C1) having a first terminal connected to the first S/D of the first NMOS of the second 2:1 MUX to supply a binary level inverted third serial RZ digital signal (d0123_bar), and a second terminal connected to the first reference voltage;

a second capacitor (C2) having a first terminal connected to the first S/D of the second NMOS of the second 2:1 MUX to supply a binary level third serial RZ digital signal (d0123), and a second terminal connected to the first reference voltage; and, a third capacitor (C3) having a first terminal connected to the second reference voltage, and a second terminal connected to the first S/D of the third PMOS of the second 2:1 MUX.

5. A charge-steering multiplexor (CSM) transmitter comprising:
   a first 2:1 multiplexor (MUX) comprising:
      a first p-channel metal-oxide-semiconductor field effect transistor (PMOS) having a first source/drain (S/D) connected to a first reference voltage, a gate to accept a first clock signal (ck1), and a second S/D;
      a second PMOS having a first S/D connected to the first reference voltage, a gate to accept the first clock signal, and a second S/D;
      a first n-channel metal-oxide-semiconductor field effect transistor (NMOS) having a first S/D connected to the second S/D of the first PMOS, a gate to accept a binary level first parallel return-to-zero (RZ) digital signal (do), and a second S/D;
      a second NMOS having a first S/D connected to the second S/D of the first NMOS, a gate to accept a binary level second parallel RZ digital signal (d2), and a second S/D;
      a third NMOS having a first S/D connected to the second S/D of the second NMOS, a gate to accept the first clock signal, and a second S/D;
      a fourth NMOS having a first S/D connected to the second S/D of the third NMOS, a gate to accept an inverted first clock signal (ck1_bar), and a second S/D connected to a second reference voltage having a lower potential than the first reference voltage;
      a fifth NMOS having a first S/D connected to the second S/D of the second PMOS, a gate to accept an inverted first parallel RZ digital signal (d0_bar), and a second S/D;
      a sixth NMOS having a first S/D connected to the second S/D of the fifth NMOS, a gate to accept an inverted second parallel RZ digital signal (d2_bar), and a second S/D;
      a seventh NMOS having a first S/D connected to the second S/D of the sixth NMOS, a gate to accept the first clock signal, and a second S/D connected to a second S/D of the third NMOS;
      a first capacitor (C1) having a first terminal connected to the second S/D of the first PMOS to supply a binary level inverted first serial RZ digital signal (d02_bar), and a second terminal connected to the second reference voltage;
      a second capacitor (C2) having a first terminal connected to the second S/D of the second PMOS to supply a binary level first serial RZ digital signal (d02), and a second terminal connected to the second reference voltage; and,
      a third capacitor (C3) having a first terminal connected to the second S/D of the third NMOS and a second terminal connected to the second reference voltage;
   a second 2:1 MUX comprising:
      a first PMOS having a first S/D connected to the first reference voltage, a gate to accept the first inverted clock signal (ck1_bar), and a second S/D;
      a second PMOS having a first S/D connected to the first reference voltage, a gate to accept the first inverted clock signal, and a second S/D;
      a first NMOS having a first S/D connected to the second S/D of the first PMOS of the second 2:1 MUX, a gate to accept a binary level third parallel RZ digital signal (d1) in phase with the first parallel RZ digital signal (d0), and a second S/D;
      a second NMOS having a first S/D connected to the second S/D of the first NMOS of the second 2:1 MUX, a gate to accept a binary level fourth parallel RZ digital signal (d3) in phase with the second parallel RZ digital signal (d2), and a second S/D;
      a third NMOS having a first S/D connected to the second S/D of the second NMOS of the second 2:1 MUX, a gate to accept the first inverted clock signal, and a second S/D;
      a fourth NMOS having a first S/D connected to the second S/D of the third NMOS of the second 2:1 MUX, a gate to accept the first clock signal, and a second S/D connected to the second reference voltage;
      a fifth NMOS having a first S/D connected to the second S/D of the second PMOS of the second 2:1 MUX, a gate to accept a binary level inverted third parallel RZ digital signal (d1_bar), and a second S/D;
      a sixth NMOS having a first S/D connected to the second S/D of the fifth NMOS of the second 2:1 MUX, a gate to accept a binary level inverted fourth parallel RZ digital signal (d3_bar), and a second S/D;
      a seventh NMOS having a first S/D connected to the second S/D of the sixth NMOS of the second 2:1 MUX, a gate to accept the first inverted clock signal, and a second S/D connected to a second S/D of the third NMOS of the second 2:1 MUX;
      a first capacitor (C1) having a first terminal connected to the second S/D of the first PMOS of the second 2:1 MUX to supply a binary level inverted second serial RZ digital signal (d13_bar) complementary in phase to the first serial RZ digital signal (d02), and a second terminal connected to the second reference voltage;
      a second capacitor (C2) having a first terminal connected to the second S/D of the second PMOS of the second 2:1 MUX to supply a binary level second serial RZ digital signal (d13), and a second terminal connected to the second reference voltage;
      a third capacitor (C3) having a first terminal connected to the second S/D of the third NMOS of the second 2:1 MUX and a second terminal connected to the second reference voltage;
   a pre-driver comprising:
      a first current source having a first terminal connected to the first reference voltage and a second terminal;
      a first PMOS having a first S/D connected to the second terminal of the first current source, a gate to accept the first serial RZ digital signal (d02), and a second S/D;
      a second PMOS having a first S/D connected to the second terminal of the first current source, a gate to accept the second serial RZ digital signal (d13), and a second S/D;
      a third PMOS having a first S/D connected to the second terminal of the current source, a gate to accept the inverted first serial RZ digital signal (d02_bar), and a second S/D;
      a fourth PMOS having a first S/D connected to the second terminal of the current source, a gate to accept the inverted second serial RZ digital signal (d13_bar), and a second S/D;

a first load having a first terminal connected to the second S/D of the second PMOS of the pre-driver to supply a binary level inverted third serial NRZ digital signal (d0123_bar), and a second terminal connected to the second reference voltage; and, a second load having a first terminal connected to the second S/D of the fourth PMOS of the pre-driver to supply a binary level third serial NRZ digital signal (d0123), and a second terminal connected to the second reference voltage.

6. The CSM transmitter of claim 5 further comprising:
a driver comprising:
   a second current source having a first terminal connected to the first reference voltage, and a second terminal;
   a seventh PMOS having a first S/D connected to the second terminal of the second current source, a gate to accept the inverted third serial NRZ digital signal (d0123_bar), and a second S/D;
   an eighth PMOS having a first S/D connected to the second terminal of the second current source, a gate to accept the third serial NRZ digital signal (d0123), and a second S/D;
   a third load having a first terminal connected to the second S/D of the seventh PMOS to supply an amplified inverted third NRZ digital signal, and a second terminal connected to the second reference voltage; and,
   a fourth load having a first terminal connected to the second S/D of the eighth PMOS to supply an amplified third NRZ digital signal, and a second terminal connected to the second reference voltage.

7. A charge-steering multiplexor (CSM) transmitter comprising:
   a first 2:1 multiplexor (MUX) comprising:
      a first n-channel metal-oxide-semiconductor field effect transistor (NMOS) having a first source/drain (SID), a gate to accept a first inverted clock signal (ck1_bar), and a second S/D connected to a first reference voltage;
      a second NMOS having a first S/D, a gate to accept the first inverted clock signal, and a second S/D connected to the first reference voltage;
      a first p-channel metal-oxide-semiconductor field effect transistor (PMOS) having a first S/D, a gate to accept a binary level first parallel return-to-zero (RZ) digital signal (do), and a second S/D connected to the first S/D of the first NMOS;
      a second PMOS having a first S/D, a gate to accept a binary level second parallel RZ digital signal (d2), and a second S/D connected to the first S/D of the first PMOS;
      a third PMOS having a first S/D, a gate to accept the first inverted clock signal, and a second S/D connected to the first S/D of the second PMOS;
      a fourth PMOS having a first S/D connected to a second reference voltage having a higher potential than the first reference voltage, a gate to accept a first clock signal (ck1), and a second S/D connected to the first S/D of the third PMOS;
      a fifth PMOS having a first S/D, a gate to accept a binary level inverted first parallel RZ digital signal (d0_bar), and a second S/D connected to the first S/D of the second NMOS;
      a sixth PMOS having a first S/D, a gate to accept a binary level inverted second parallel RZ digital signal (d2_bar), and a second S/D connected to the first S/D of the fifth PMOS;
      a seventh PMOS having a first S/D connected to the first S/D of the third PMOS, a gate to accept the first inverted clock signal, and a second S/D connected to the first S/D of the sixth PMOS;
      a first capacitor (C1) having a first terminal connected to the first S/D of the first NMOS to supply a binary level inverted first serial RZ digital signal (d02_bar), and a second terminal connected to the first reference voltage;
      a second capacitor (C2) having a first terminal connected to the first S/D of the second NMOS to supply a binary level first serial RZ digital signal (d02), and a second terminal connected to the first reference voltage;
      a third capacitor (C3) having a first terminal connected to the second reference voltage, and a second terminal connected to the first S/D of the third PMOS;
   a second 2:1 MUX comprising:
   a first NMOS having a first S/D, a gate to accept the first clock signal (ck1), and a second S/D connected to the first reference voltage;
   a second NMOS having a first S/D, a gate to accept the first clock signal, and a second S/D connected to the first reference voltage;
   a first PMOS having a first S/D, a gate to accept a binary level third parallel RZ digital signal (d1), and a second S/D connected to the first S/D of the first NMOS of the second 2:1 MUX;
   a second PMOS having a first S/D, a gate to accept a binary level fourth parallel RZ digital signal (d3), and a second S/D connected to the first S/D of the first PMOS of the second 2:1 MUX;
   a third PMOS having a first S/D, a gate to accept the first clock signal, and a second S/D connected to the first S/D of the second PMOS of the second 2:1 MUX;
   a fourth PMOS having a first S/D connected to the second reference voltage having a higher potential than the first reference voltage, a gate to accept the first inverted clock signal (ck1_bar), and a second S/D connected to the first S/D of the third PMOS of the second 2:1 MUX;
   a fifth PMOS having a first S/D, a gate to accept a binary level inverted third parallel RZ digital signal (d1_bar), and a second S/D connected to the first S/D of the second NMOS of the second 2:1 MUX;
   a sixth PMOS having a first S/D, a gate to accept a binary level inverted fourth parallel RZ digital signal (d3_bar), and a second S/D connected to the first S/D of the fifth PMOS of the second 2:1 MUX;
   a seventh PMOS having a first S/D connected to the first S/D of the third PMOS of the second 2:1 MUX, a gate to accept the first clock signal, and a second S/D connected to the first S/D of the sixth PMOS of the second 2:1 MUX;
   a first capacitor (C1) having a first terminal connected to the first S/D of the first NMOS of the second 2:1 MUX to supply a binary level inverted second serial RZ digital signal (d13_bar), and a second terminal connected to the first reference voltage;
   a second capacitor (C2) having a first terminal connected to the first S/D of the second NMOS of the second 2:1 MUX to supply a binary level second serial RZ digital signal (d13), and a second terminal connected to the first reference voltage;

a third capacitor (C3) having a first terminal connected to the second reference voltage, and a second terminal connected to the first S/D of the third PMOS of the second 2:1 MUX;

a pre-driver comprising:
- a first load having a first terminal connected to the second reference voltage and a second terminal to supply a binary level inverted third serial NRZ digital signal (d0123_bar);
- a second load having a first terminal connected to the second reference voltage and a second terminal to supply a binary level third serial NRZ digital signal (d0123) a first NMOS having a first S/D connected to the second terminal of the first load, a gate to accept the second serial RZ digital signal (d13), and a second S/D;
- a second NMOS having a first S/D connected to the second terminal of the first load, a gate to accept the first serial RZ digital signal (d02), and a second S/D;
- a third NMOS having a first S/D connected to the second terminal of the second load, a gate to accept the inverted second serial RZ digital signal (d13_bar), and a second S/D;
- a fourth NMOS having a first S/D connected to the second terminal of the second load, a gate to accept the inverted first serial RZ digital signal (d02_bar), and a second S/D; and
- a first current source having a first terminal connected to the second S/D of the first, second, third, and fourth NMOSs of the pre-driver, and a second terminal connected to the first reference voltage.

8. The CSM transmitter of claim 7 further comprising:
a driver comprising:
- a third load having a first terminal connected to the second reference voltage and a second terminal to supply an amplified inverted third NRZ digital signal;
- a fourth load having a first terminal connected to the second reference voltage and a second terminal to supply an amplified third NRZ digital signal;
- a first NMOS having a first S/D connected to the second terminal of the first load, a gate to accept the third serial NRZ digital signal (d0123), and a second S/D;
- a second NMOS having a first S/D connected to the second terminal of the second load, a gate to accept the inverted third serial RZ digital signal (d0123_bar), and a second S/D; and,
- a second current source having a first terminal connected to the second S/D of the first and second NMOSs of the driver, and a second terminal connected of the first reference voltage.

* * * * *